(12) United States Patent
You et al.

(10) Patent No.: US 12,289,873 B2
(45) Date of Patent: Apr. 29, 2025

(54) POWER MODULE

(71) Applicants: Hyundai Motor Company, Seoul (KR); Kia Corporation, Seoul (KR)

(72) Inventors: Myung Ill You, Gwangju (KR); Nam Sik Kong, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 272 days.

(21) Appl. No.: 17/985,418

(22) Filed: Nov. 11, 2022

(65) Prior Publication Data

US 2024/0008231 A1 Jan. 4, 2024

(30) Foreign Application Priority Data

Jul. 1, 2022 (KR) ........................ 10-2022-0081370

(51) Int. Cl.
*H05K 7/06* (2006.01)
*H01L 21/52* (2006.01)
(Continued)

(52) U.S. Cl.
CPC ........... *H05K 7/20945* (2013.01); *H05K 7/06* (2013.01); *H02M 1/327* (2021.05)

(58) Field of Classification Search
CPC ........ H05K 3/107; H05K 3/3468; H05K 7/06; H05K 7/209; H05K 7/20945; H02M 1/327; H01L 21/52; H01L 21/563; H01L 21/565; H01L 21/4825; H01L 21/4846; H01L 21/4871; H01L 21/4882; H01L 23/047; H01L 23/051; H01L 23/48; H01L 23/50; H01L 23/147; H01L 23/295; H01L 23/373; H01L 23/473; H01L 23/492; H01L 23/498; H01L 23/562; H01L 23/645; H01L 23/647; H01L 23/3107; H01L 23/3134; H01L 23/3675; H01L 23/3677; H01L 23/3735; H01L 23/3736; H01L 23/4334; H01L 23/4924; H01L 23/5385; H01L 23/49531; H01L 23/49537; H01L 23/49562; H01L 23/49822; H01L 23/49833; H01L 24/03; H01L 24/05; H01L 24/08; H01L 24/17;
(Continued)

(56) References Cited

U.S. PATENT DOCUMENTS 6,054,754 A * 4/2000 Bissey ............... H01L 24/49
257/532
9,922,911 B1 * 3/2018 Park ................. H01L 23/49562
(Continued)

FOREIGN PATENT DOCUMENTS

KR 10-2018-0052143 A 5/2018
KR 10-2023-0172344 A 12/2023

*Primary Examiner* — Xiaoliang Chen
(74) *Attorney, Agent, or Firm* — Morgan, Lewis & Bockius LLP (57) ABSTRACT

A power module comprises a chip, a power lead electrically connected to the chip and at least one substrate, each of at least one substrate including an outer metal layer bonded to an outer side portion of an insulating layer and an inner metal layer bonded to an inner side portion of the insulating layer, respectively, wherein the outer metal layer and the inner metal layer have different perimeters so that the outer metal layer and the inner metal layer have asymmetric structures.

9 Claims, 6 Drawing Sheets

(51) Int. Cl.
  *H01L 23/047* (2006.01)
  *H01L 23/051* (2006.01)
  *H01L 23/373* (2006.01)
  *H01L 23/473* (2006.01)
  *H01L 23/48* (2006.01)
  *H01L 23/492* (2006.01)
  *H01L 23/498* (2006.01)
  *H01L 23/50* (2006.01)
  *H01L 25/07* (2006.01)
  *H01L 25/16* (2023.01)
  *H01L 25/18* (2023.01)
  *H05K 7/20* (2006.01)
  *H02M 1/32* (2007.01)

(58) Field of Classification Search
  CPC ......... H01L 24/29; H01L 24/32; H01L 24/33; H01L 24/37; H01L 24/40; H01L 24/48; H01L 24/49; H01L 24/73; H01L 24/78; H01L 24/80; H01L 24/81; H01L 24/83; H01L 24/85; H01L 24/92; H01L 25/07; H01L 25/072; H01L 25/074; H01L 25/0657; H01L 25/16; H01L 25/18; H01L 25/50; H01L 25/162
  USPC ........ 361/784; 257/401, 703, 737, 751, 776, 257/788, 21.51, 21.511, 23.051, 23.009, 257/23.106; 438/125, 597
  See application file for complete search history.

(56) References Cited

U.S. PATENT DOCUMENTS

| | | | | |
|---|---|---|---|---|
| 11,862,530 B2* | 1/2024 | You | | H01L 23/4334 |
| 2002/0070439 A1* | 6/2002 | Hiramatsu | | H01L 23/293 |
| | | | | 257/789 |
| 2005/0193822 A1* | 9/2005 | Amano | | G06V 40/1306 |
| | | | | 73/704 |
| 2005/0193823 A1* | 9/2005 | Amano | | G06V 40/1306 |
| | | | | 73/704 |
| 2005/0210988 A1* | 9/2005 | Amano | | H10N 39/00 |
| | | | | 438/52 |
| 2006/0192291 A1* | 8/2006 | Yokozuka | | H01L 24/33 |
| | | | | 257/776 |
| 2006/0202324 A1* | 9/2006 | Hashimoto | | H01L 21/4882 |
| | | | | 257/E23.189 |
| 2008/0087902 A1* | 4/2008 | Lee | | H01L 27/153 |
| | | | | 257/E33.045 |
| 2008/0093729 A1* | 4/2008 | Siepe | | H01L 24/05 |
| | | | | 257/E21.511 |
| 2008/0122091 A1* | 5/2008 | Gutt | | H01L 24/03 |
| | | | | 257/E29.143 |
| 2008/0136015 A1* | 6/2008 | Lee | | H01L 23/142 |
| | | | | 257/E21.511 |
| 2009/0174044 A1* | 7/2009 | Eom | | H01L 23/49531 |
| | | | | 257/E21.705 |
| 2009/0189263 A1* | 7/2009 | Baba | | H01L 23/4827 |
| | | | | 257/676 |
| 2009/0194859 A1* | 8/2009 | Kang | | H01L 24/49 |
| | | | | 257/676 |
| 2009/0213546 A1* | 8/2009 | Hassani | | H01L 23/473 |
| | | | | 361/702 |
| 2010/0096662 A1* | 4/2010 | Lin | | H01L 33/486 |
| | | | | 257/E33.056 |
| 2010/0295172 A1* | 11/2010 | Gao | | H01L 25/071 |
| | | | | 257/E23.08 |
| 2010/0308421 A1* | 12/2010 | Muto | | H01L 23/49562 |
| | | | | 257/E23.116 |
| 2011/0006410 A1* | 1/2011 | Baba | | H01L 23/49503 |
| | | | | 257/676 |
| 2011/0031608 A1* | 2/2011 | Kim | | H01L 23/142 |
| | | | | 257/692 |
| 2012/0300412 A1* | 11/2012 | Song | | H01L 23/49822 |
| | | | | 361/728 |
| 2015/0035137 A1* | 2/2015 | Nishimoto | | B23K 35/0244 |
| | | | | 228/245 |
| 2015/0130053 A1* | 5/2015 | Hara | | H01L 24/73 |
| | | | | 257/737 |
| 2015/0255419 A1* | 9/2015 | Nishimoto | | C04B 37/026 |
| | | | | 257/773 |
| 2017/0077068 A1* | 3/2017 | Horio | | H01L 25/18 |
| 2017/0338208 A1* | 11/2017 | Letowski | | H01L 25/072 |
| 2017/0365583 A1* | 12/2017 | Im | | H01L 21/565 |
| 2018/0019180 A1* | 1/2018 | Murakami | | H01L 25/072 |
| 2018/0082920 A1* | 3/2018 | Hiyoshi | | H01L 23/3675 |
| 2018/0240732 A1* | 8/2018 | Tonedachi | | H01L 24/48 |
| 2019/0067251 A1* | 2/2019 | Bando | | H01L 23/473 |
| 2019/0080979 A1* | 3/2019 | Tonedachi | | H01L 24/32 |
| 2019/0279943 A1* | 9/2019 | Soda | | H01L 25/07 |
| 2019/0306981 A1* | 10/2019 | Furuyama | | H05K 1/162 |
| 2019/0326195 A1* | 10/2019 | Han | | H01L 21/565 |
| 2020/0075529 A1* | 3/2020 | Otsuka | | H01L 23/49844 |
| 2020/0294925 A1* | 9/2020 | Yamada | | H01L 24/06 |
| 2020/0335422 A1* | 10/2020 | Park | | H01L 23/4334 |
| 2021/0035893 A1* | 2/2021 | Kawashiro | | H01L 23/49575 |
| 2021/0074666 A1* | 3/2021 | Kawashiro | | H01L 25/18 |
| 2021/0175148 A1* | 6/2021 | Takizawa | | H01L 21/4882 |
| 2021/0210407 A1* | 7/2021 | Liu | | H01L 23/3107 |
| 2021/0210477 A1* | 7/2021 | Gurpinar | | H01L 23/3735 |
| 2021/0281040 A1* | 9/2021 | Liu | | H01S 5/06825 |
| 2021/0305215 A1* | 9/2021 | Sato | | H01L 24/48 |
| 2021/0351100 A1* | 11/2021 | Vladimirova | | H01L 23/3735 |
| 2021/0358829 A1* | 11/2021 | You | | H01L 24/32 |
| 2021/0366796 A1* | 11/2021 | Higashi | | H01L 23/049 |
| 2022/0044988 A1* | 2/2022 | Park | | H05K 3/3468 |
| 2022/0068769 A1* | 3/2022 | Kim | | H01L 23/498 |
| 2022/0115291 A1* | 4/2022 | Kim | | H01L 23/3675 |
| 2022/0208641 A1* | 6/2022 | Yeh | | H01L 23/564 |
| 2022/0254700 A1* | 8/2022 | Kim | | H01L 23/49548 |
| 2023/0397336 A1* | 12/2023 | Kong | | H01L 23/4334 |

* cited by examiner

POWER MODULE

CROSS REFERENCE TO RELATED APPLICATION

The present application claims priority to Korean Patent Application No. 10-2022-0081370, filed on July 1 in Korean Intellectual Property Office, 2022, the entire contents of which is incorporated herein for all purposes by this reference.

TECHNICAL FIELD

The present disclosure relates to a power module. More particularly, the present disclosure relates to a power module in which a substrate is electrically connected to a chip to configure a circuit and enable cooling to be performed for the circuit and that reduces the size of the substrate to miniaturize the power module and ensure high temperature durability of the substrate.

BACKGROUND

A power conversion device (for example, an inverter), which is one of core components of hybrid vehicles and electric vehicles, is a major component of eco-friendly vehicles, and much technological development is underway. The development of a power module, which is a core component of the power conversion device and accounts for the most cost, is a key technology in the field of eco-friendly vehicles.

In the case of a double-sided cooling power module, electrical connection of an insulating substrate including an upper substrate and a lower substrate is required for circuit configuration. In this case, a spacer is used and serves to electrically connect the upper substrate and the lower substrate.

That is, the double-sided cooling power module is provided with an insulating substrate for electrical insulation and mechanical protection. In addition, a molding process is applied for insulation and mechanical protection of internal components other than the insulating substrate.

However, in the case of the power module, a high voltage is used, so an insulation distance is required to prevent a short circuit between components. Such an insulation distance includes a distance between the insulating substrate constituting the power module and a power lead, and there is a problem in that an overall size of the power module is inevitably increased in order to secure the insulation distance. In addition, when the overall size of the power module is increased, it is disadvantageous for packaging, and as the size of the insulating substrate is also increased, deformation of the insulating substrate is generated due to high temperature heat, so there is a problem that adverse effects are generated according to the durability problem.

The foregoing is intended merely to aid in the understanding of the background of the present disclosure and should not be taken as acknowledging that they correspond to the prior art already known to those of ordinary skill in the art.

SUMMARY

Accordingly, the present disclosure has been made keeping in mind the above problems occurring in the related art, and the present disclosure is intended to provide a power module in which a substrate is electrically connected to a chip to configure a circuit and enable cooling to be performed for the circuit and that reduces the size of the substrate to miniaturize the power module and ensure high temperature durability of the substrate.

In order to achieve the above objective, according to the present disclosure, there may be provided a power module including: a chip; a power lead electrically connected to the chip; and at least one substrate, each of the at least one substrate including an outer metal layer bonded to an outer side portion of an insulating layer and an inner metal layer bonded to an inner side portion of the insulating layer disposed between the outer metal layer and the inner metal layer, respectively. The outer metal layer and the inner metal layer have different perimeters so that the outer metal layer and the inner metal layer have asymmetric structures.

The at least one substrate may include an upper substrate and a lower substrate, wherein the upper substrate is disposed at a portion above the chip and may include: a first insulating layer; and a first outer metal layer and a first inner metal layer bonded to an upper surface and a lower surface of the first insulating layer, respectively, and the lower substrate is disposed at a portion under the chip and may include: a second insulating layer; and a second outer metal layer and a second inner metal layer bonded to an upper surface and a lower surface of the second insulating layer, respectively.

The power module may further include a mold part integrally molding the chip, the power lead, the upper substrate, and the lower substrate, wherein the power lead may be connected to the first inner metal layer or the second inner metal layer and may have a portion extending to an outside of the mold part.

The outer metal layer may has a smaller perimeter than the inner metal layer.

The inner metal layer includes a pattern to provide an electrical connection relationship with the chip so that the perimeter of the outer metal layer may be provided to be smaller than a perimeter of the inner metal layer.

The perimeter of the outer metal layer may be provided to be smaller than the perimeter of the inner metal layer based on the pattern of the inner metal layer so that the outer metal layer and the inner metal layer have a same volume ratio.

The outer metal layer may be provided to have a smaller thickness than the inner metal layer so as to have the same volume ratio as the inner metal layer.

The outer metal layer may have the perimeter and the thickness adjusted based on an insulation distance between the outer metal layer and the power lead.

The outer metal layer may be configured to have the same volume ratio with respect to the inner metal layer by reducing a width and a length of the outer metal layer by a same length.

The outer metal layer may be provided with the smaller perimeter than the inner metal layer, wherein the chip and the pattern of the inner metal layer are provided to be all included within an area of the outer metal layer.

As described above, the power module having the structure described above allows an outer metal layer and an inner metal layer to constitute an asymmetric structure in the outer metal layer, the insulating layer, and the inner metal layer constituting the substrate, whereby a short circuit between the substrate and the power lead is prevented, and high temperature durability of the substrate is ensured while the power module is miniaturized.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Hereinbelow, exemplary embodiments of the present disclosure will be described in detail with reference to the accompanying drawings, wherein the embodiments disclosed herein will be described in detail with reference to the accompanying drawings, wherein the same or similar elements are assigned the same reference numbers regardless of drawing numerals, and overlapping descriptions thereabout will be omitted.

Suffixes "module" and "part" for components used in the following description are given or mixed in consideration of only the ease of writing the specification and do not have distinctive meanings or roles by themselves.

In describing the embodiments disclosed in the present specification, when it is determined that detailed descriptions of related known technologies may obfuscate the gist of the embodiments disclosed in the present specification, the detailed description thereof will be omitted. In addition, the accompanying drawings are only for easy understanding of the embodiments disclosed in the present specification, wherein the technical spirit disclosed herein is not limited by the accompanying drawings and should be understood to include all changes, and equivalents or substitutes included in the spirit and scope of the present disclosure.

Terms including an ordinal number, such as first, second, and the like, may be used to describe various elements, but the elements are not limited by the terms. The above terms are used only for the purpose of distinguishing one element from another.

When an element is referred to as being "connected" or "coupled" to another element, it may be directly connected or coupled to another element, but it should be understood that other elements may exist in the middle. On the other hand, when it is referred to that a certain element is "directly connected" or "directly coupled" to another element, it should be understood that no other element is present in the middle.

A singular expression includes a plural expression unless a context clearly dictates otherwise.

In the present specification, terms such as "comprise" or "have" are intended to designate that a feature, a number, a step, an operation, an element, a part, or combinations thereof described in the present specification exist, but it should be understood that this does not preclude the existence or addition of one or more other features, numbers, steps, operations, elements, parts, or combinations thereof.

Hereinafter, a power module according to an exemplary embodiment of the present disclosure will be described with reference to the accompanying drawings.

Figure 1:
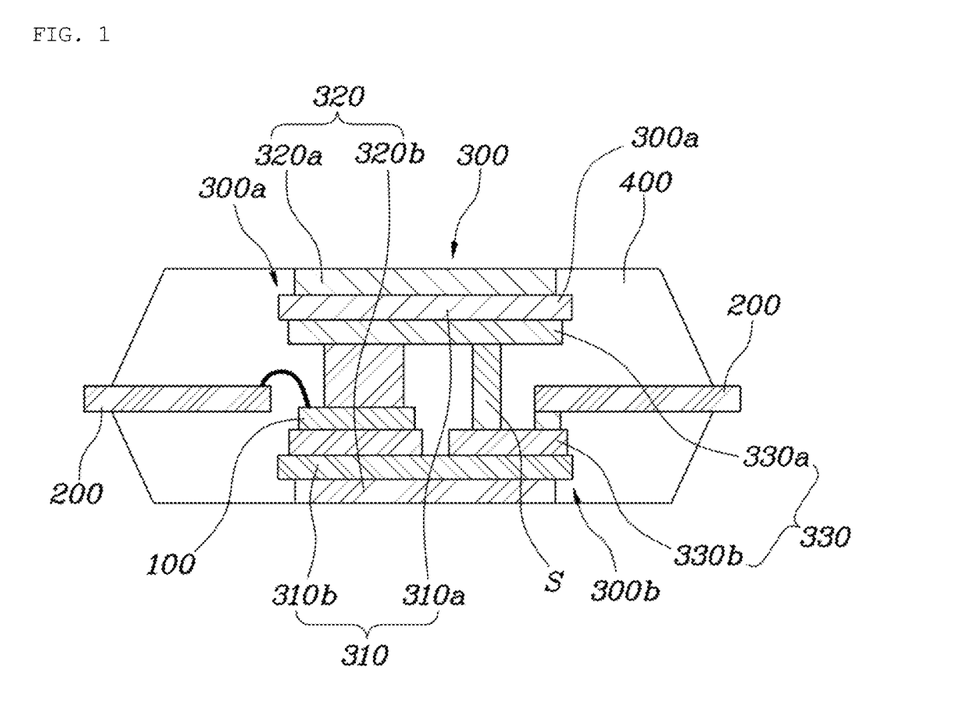
FIG. 1 is a view showing a power module according to the present disclosure.
Figure 2:
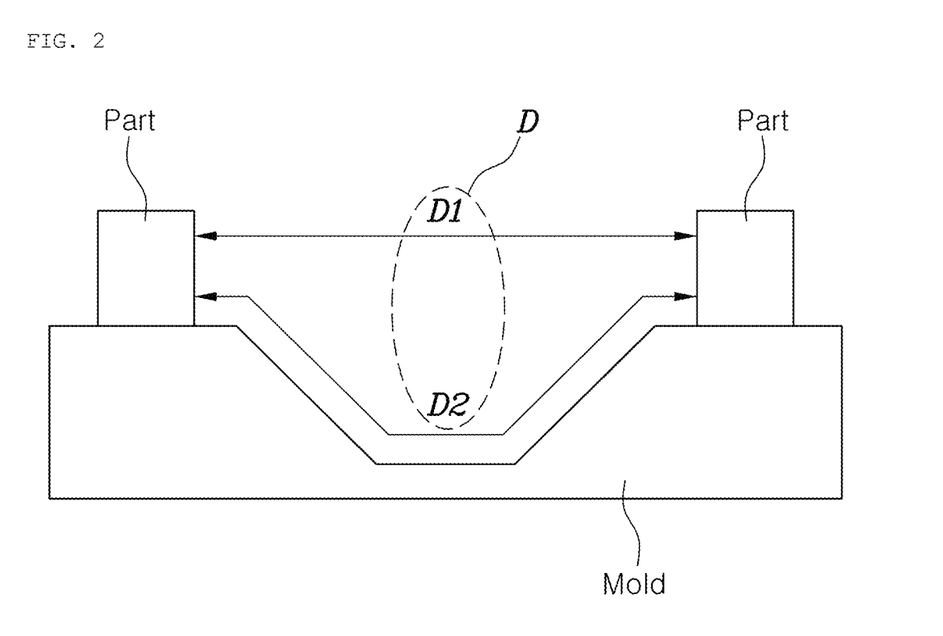
FIG. 2 is a view illustrating an insulation distance.
Figure 3:
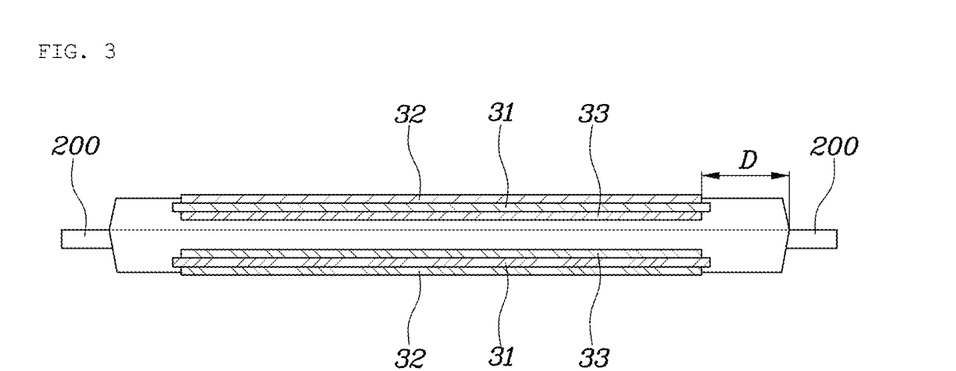
FIG. 3 is a view showing an upper substrate and a lower substrate according to a conventional power module.
Figure 4:
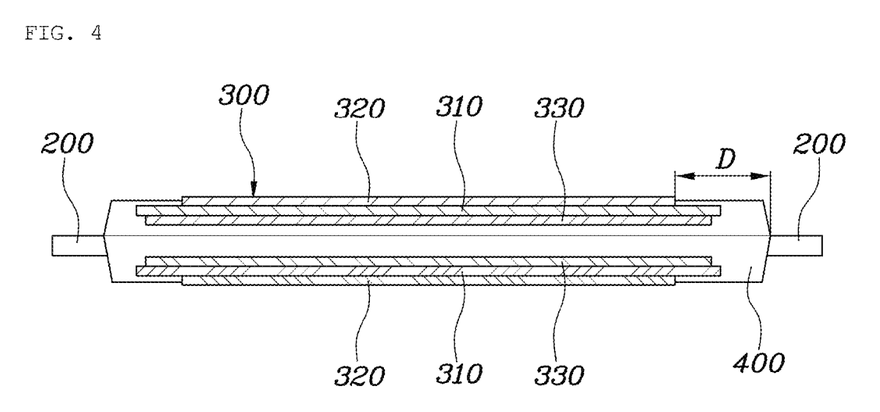
FIG. 4 is a view showing an upper substrate and a lower substrate of the power module according to the present disclosure.
Figure 5:
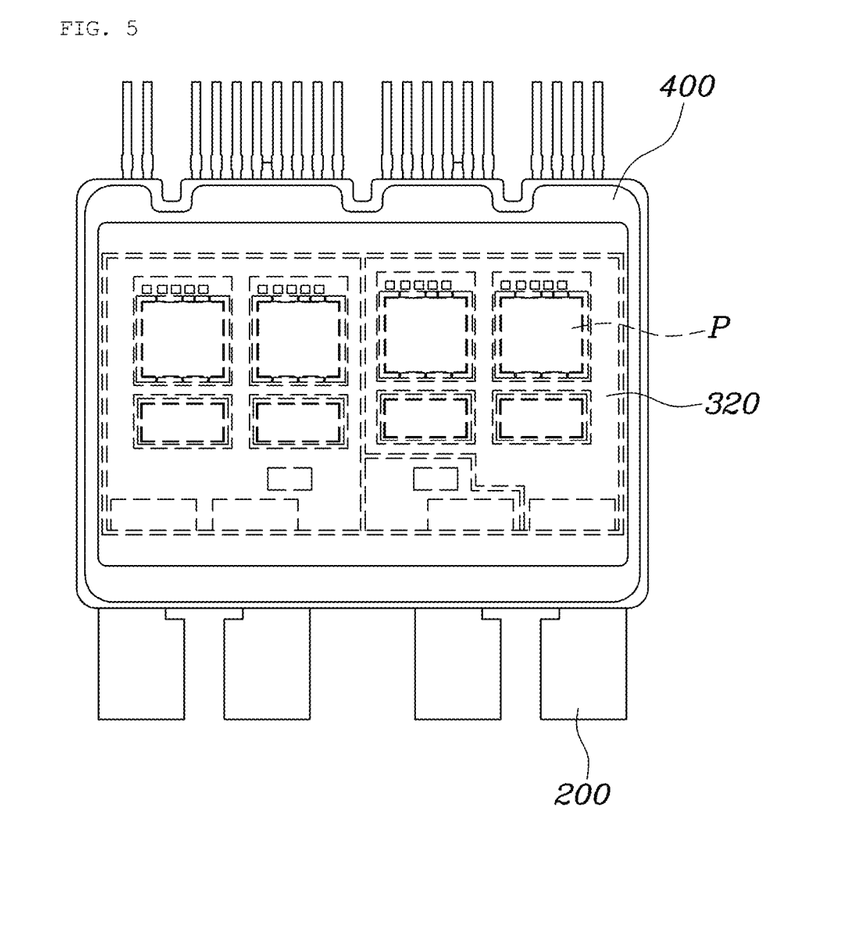
FIG. 5 is a view showing a chip and the substrates of the power module according to the present disclosure.
Figure 6:
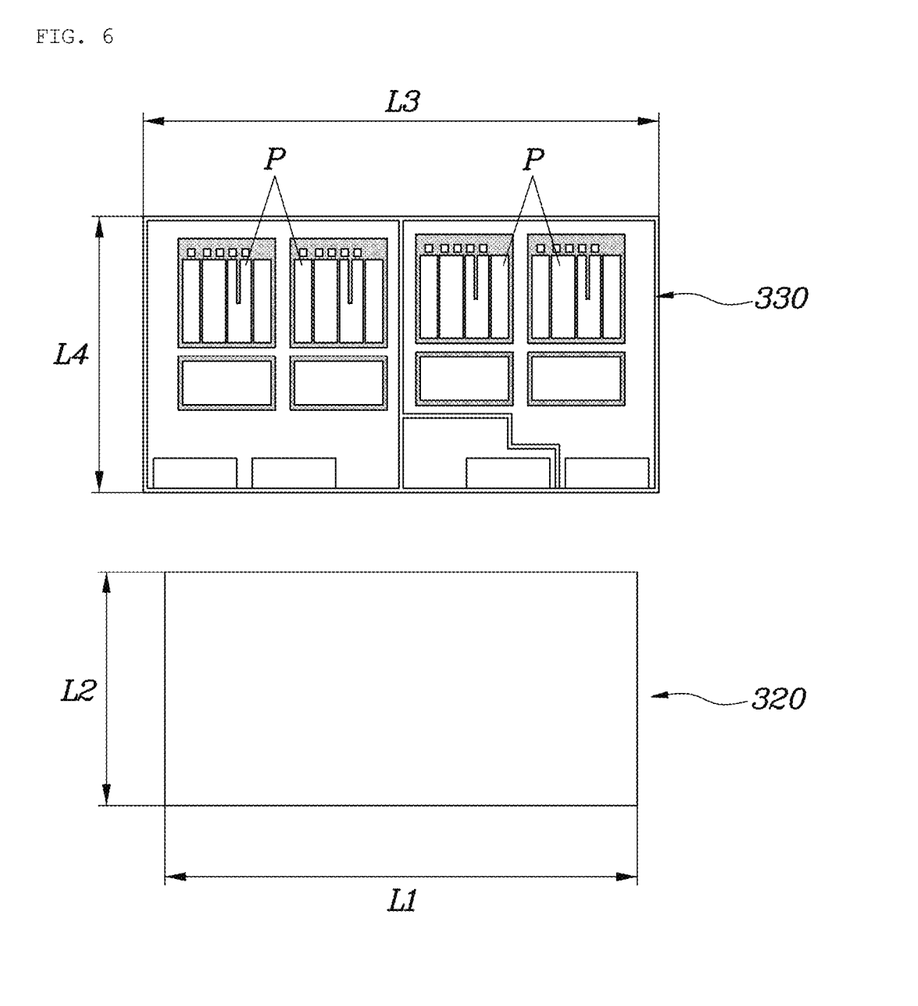
FIG. 6 is a view illustrating an outer metal layer and an inner metal layer of the power module according to the present disclosure.

FIG. 1 is a view showing a power module according to the present disclosure, FIG. 2 is a view illustrating an insulation distance, FIG. 3 is a view showing an upper substrate and a lower substrate according to a conventional power module, FIG. 4 is a view showing an upper substrate and a lower substrate of the power module according to the present disclosure, FIG. 5 is a view showing a chip and the substrate of the power module according to the present disclosure, and FIG. 6 is a view illustrating an outer metal layer and an inner metal layer of the power module according to the present disclosure.

As shown in FIG. 1, the power module according to the present disclosure includes: a chip 100; a power lead 200 electrically connected to the chip 100; and a pair of substrates 300 each including one outer metal layer 320 bonded to an outer side portion and one inner metal layer 330 bonded to an inner side portion with one corresponding insulating layer as a center, respectively, and each provided to be asymmetric due to, in the case of the outer metal layer 320 and the inner metal layer 330, the perimeters being provided to be different from one another. In the present disclosure, among the insulating layer 310, the outer metal layer 320, and the inner metal layer 330 constituting the substrates 300, the outer metal layer 320 and the inner metal layer 330 are provided in asymmetric structures by providing the perimeters to be different from one another, whereby the overall size of the power module is reduced. In particular, in the case of the outer metal layer 320, the perimeter is provided to be smaller than the perimeter of the inner metal layer 330, so an insulation distance D between the outer metal layer 320 and a part including the power lead 200 is secured. As a result, it is possible to reduce the overall size provided due to the molding of the power module while preventing a short circuit between the parts.

In detail, the substrate 300 includes an upper substrate 300a and a lower substrate 300b disposed at portions above and under the chip 100, respectively. Here, the upper substrate 300a is disposed at a portion above the chip 100 and includes: a first insulating layer 310a; and a first outer metal layer 320a and a first inner metal layer 330a bonded to an upper surface and a lower surface of the first insulating layer 310a, respectively. Similarly, the lower substrate 300b is disposed at a portion under the chip 100 and includes: a second insulating layer 310b; and a second outer metal layer 320b and a second inner metal layer 330b bonded to an upper surface and a lower surface of the second insulating layer 310b, respectively.

In addition, the power module further includes a mold part 400 integrally molding the chip 100, the power lead 200, the upper substrate 300a, and the lower substrate 300b, wherein the power lead 200 is connected to the first inner metal layer 330a or the second inner metal layer 330b and has a portion that may extend to the outside of the mold part 400.

Furthermore, the power module may further include a spacer S disposed to be spaced apart from the chip 100 between the upper substrate 300a and the lower substrate 300b and connected between the first inner metal layer 330a of the upper substrate 300a and the second inner metal layer 330b of the lower substrate 300b. The spacer S is characterized in that it secures a space between the upper substrate 300a and the lower substrate 300b, thereby reducing heat generation during the operation of the power module.

In the power module of the present disclosure, a plurality of chips 100 may be configured, and a plurality of power leads 200 may also be configured to transmit electrical signals. In addition, in the power module of the present disclosure, a structure may be applied such that a cooling channel (not shown) configured to cool the heat generated in the chip 100 during the operation of the power module is provided, and the heat transferred to the upper substrate 300*a* and the lower substrate 300*b* is cooled through the cooling channel (not shown).

As such, the power module according to the present disclosure is integrally provided by molding the chip 100, the upper substrate 300*a*, the lower substrate 300*b*, and the power lead 200 through the mold part 400, wherein the power lead 200 disposed to be spaced apart from the chip 100 is connected to the first inner metal layer 330*a* of the upper substrate 300*a* or the second inner metal layer 330*b* of the lower substrate 300*b*. Here, the power lead 200 serves to transmit to or receive from the chip 100 an electrical signal and should not be simultaneously connected to the upper substrate 300*a* and the lower substrate 300*b* but may be connected through the spacer S disposed between the upper substrate 300*a* and the lower substrate 300*b*. Here, the power lead 200 serves to transmit to or receive from the chip 100 an electrical signal and should not be simultaneously connected to the upper substrate 300*a* and the lower substrate 300*b* but may be connected through the spacer S disposed between the upper substrate 300*a* and the lower substrate 300*b*.

Such a power lead 200 extends for other power modules or power supply to the outside of the mold part 400.

However, the power module uses a high voltage, so insulation between components is essential. Accordingly, an insulation distance D between the substrate 300 and the power lead 200 is required, and the mold part 400 serves as an insulator at a location between the substrate 300 and the power lead 200. That is, the parts exposed to the outside of the mold part 400 in the power module satisfy a required insulation distance D to secure insulation properties but may cause damage to the power module by a short circuit occurring when the insulation distance D between each part is not secured. With reference to FIG. 2, the insulation distance D is divided into clearance distance D1 and creepage distance D2, and the clearance distance D1 and the creepage distance D2 are set according to the electrical specifications of each part constituting the power module, whereby the insulation distance D may be determined.

However, as shown in FIG. 3, the overall size of the power module is to be increased in order to secure the insulation distance D. That is, in the related art, an outer metal layer 32 and an inner metal layer 33 are identically provided around an insulating layer 31. In this case, a pattern for circuit configuration is provided on the inner metal layer 33, so the inner metal layer 33 is made of a small volume compared with the outer metal layer 32 due to the pattern. Due to this, when high temperature heat is generated in the power module, the outer metal layer 32 generates expansion more than the inner metal layer 33 because of having a large volume, thereby causing a problem of being damaged due to repeated stress occurrences such as deformation, bending, or the like.

As such, the conventional power module has disadvantages in that the overall size is increased and durability is reduced due to the volume difference between the outer metal layer 32 and the inner metal layer 33.

Accordingly, the power module according to the present disclosure provides the perimeters of the outer metal layer 320 and the inner metal layer 330 constituting the substrate 300 to be different, thereby minimizing the overall size thereof and enabling the problem of deformation due to heat to be solved.

To describe in detail with respect to the power module according to the present disclosure, as shown in FIG. 4, the substrate 300 is provided such that the outer metal layer 320 has a smaller perimeter compared with the inner metal layer 330. In this way, of the outer metal layer 320 and the inner metal layer 330 constituting the substrate 300, the perimeter of the outer metal layer 320 is provided to be smaller, whereby, even when the separation distance between the outer metal layer 320 exposed to the outside of the mold part 400 and the power lead 200 is secured as much as the insulation distance D, the overall size of the mold part 400 may be reduced.

That is, as a pattern P configured to provide an electrical connection relationship with the chip 100 is provided on the inner metal layer 330 of the substrate 300, the perimeter of the outer metal layer 320 is provided to be smaller than the perimeter of the inner metal layer 330.

The outer metal layer 320 and the inner metal layer 330 have a volume difference as the pattern P is provided on the inner metal layer 330, thereby generating a difference in thermal expansion. Therefore, when a high temperature is generated inside the power module, the bending deformation of the outer metal layer 320 is accelerated. In the present disclosure, the perimeter of the outer metal layer 320 is provided to be smaller than the perimeter the inner metal layer 330, so that the volume difference between the outer metal layer 320 and the inner metal layer 330 is cleared.

In particular, as the outer metal layer 320 and the inner metal layer 330 are provided to have the same volume ratio, the perimeter of the outer metal layer 320 is provided to be small taking the pattern P of the inner metal layer 330 into consideration. That is, the perimeter of the outer metal layer 320 is provided to be smaller than the perimeter of the inner metal layer 330, wherein the perimeter of the outer metal layer 320 is provided to be small to an extent that the volume ratio becomes the same. Accordingly, the volume ratio of the outer metal layer 320 and the inner metal layer 330 may be provided within the same range.

In addition, the outer metal layer 320 is provided to have a smaller perimeter compared with the perimeter of the inner metal layer 330 on which the pattern P is provided, so that, even when the separation distance between the outer metal layer 320 and the power lead 200, which are exposed to the outside of the mold part 400, is secured as much as the insulation distance D, the overall size of the mold part 400 may be reduced.

Meanwhile, the outer metal layer 320 may be provided to have a smaller thickness taking the inner metal layer into consideration so as to have the same volume ratio as the inner metal layer 330. In this way, when the volume ratio of the outer metal layer 320 and the inner metal layer 330 is provided to be the same, not only the perimeter but also the thickness may be adjusted together to match the volume ratio of the outer metal layer 320 and the inner metal layer 330 and, at the same time, the size of the outer metal layer 320 may be minimized, and the durability of the outer metal layer 320 may be secured.

In addition, the outer metal layer 320 has the perimeter and thickness adjusted on the basis of the insulation distance D between the outer metal layer 320 and the power lead 200. Here, the insulation distance D may be determined when designing a distance between the outer metal layer 320 and the power lead 200, and on the basis of the insulation distance D between the outer metal layer 320 and the power lead 200, the circumference and thickness of the outer metal layer 320 are adjusted, whereby the volume ratio of the outer metal layer 320 and the inner metal layer 330 may be provided to be within the same range. Here, the perimeter of the outer metal layer 320 is provided to be in a range that at least secures the insulating distance D between the outer metal layer 320 and the power lead 200, and the thickness of the outer metal layer 320 may be increased to further reduce the perimeter, whereby the overall size of the mold part 400 may be reduced.

Meanwhile, the outer metal layer 320 may be provided to have the same volume ratio with respect to the inner metal layer 330 by reducing each side of the perimeter by the same length.

That is, in the outer metal layer 320, the width and length are each reduced by the same length, whereby the stress caused by the high temperature heat generated inside the power module is not concentrated in any one place. In the case in which any one side of the perimeter of the outer metal layer 320 is reduced unevenly when the perimeter of the outer metal layer 320 is reduced, stress may be concentrated in a corresponding portion, and durability may be reduced. Accordingly, the sides of the circumference of the outer metal layer 320 are reduced by the same length to ensure the durability of the outer metal layer 320.

On the other hand, as shown in FIGS. 5 to 6, the outer metal layer 320 is provided with a smaller perimeter than the inner metal layer 330, wherein the chip 100 and the pattern P of the inner metal layer 330 are provided to be all included within the area of the outer metal layer 330. That is, the chip 100 and the pattern P are configured within an area of the inner metal layer 330, the area being the same as the area of the outer metal layer 320. In the present disclosure, as the area of the outer metal layer 320 is reduced, it is required to take into account the chip 100 and the pattern P of the inner metal layer.

Accordingly, the perimeter of the outer metal layer 320 may be provided to be smaller than the perimeter of the inner metal layer 330. That is, as an example, with reference to FIG. 6, a width length L1 and a length L2 of the outer metal layer 320 are smaller than a width length L3 and a length L4 of the inner metal layer 330, respectively. Accordingly, the perimeter of the outer metal layer 320 is provided to be smaller than the perimeter of the inner metal layer 330. Here, by providing the chip 100 and the pattern P of the inner metal layer 330 to be included within the area that is the same as the area of the outer metal layer 320, the installation stability of the chip 100 is secured and, even when the area of the outer metal layer 320 is reduced, the reliability of the power module is ensured.

The power module having the structure described above makes the outer metal layer and the inner metal layer constitute an asymmetric structure in the outer metal layer, the insulating layer, and the inner metal layer constituting the substrate, whereby a short circuit between the substrate and the power lead is prevented, high temperature durability of the substrate is ensured, and the power module is miniaturized.

While the present disclosure has been shown and described with respect to specific embodiments, it will be apparent to those of ordinary skill in the art that the present disclosure may be variously improved and changed without departing from the technical spirit of the present disclosure provided by the following claims.

What is claimed is:

1. A power module comprising:
   a chip;
   a power lead electrically connected to the chip; and
   at least one substrate, each of at least one substrate including an outer metal layer bonded to an outer side portion of an insulating layer and an inner metal layer bonded to an inner side portion of the insulating layer disposed between the outer metal layer and the inner metal layer, respectively, wherein the outer metal layer and the inner metal layer have different distance between two end portions of the metal layers in a horizontal direction perpendicular to a stack direction of the metal layers so that the outer metal layer and the inner metal layer have asymmetric structures,
   wherein the distance of the outer metal layer is provided to be smaller than the distance of the inner metal layer so that the outer metal layer and the inner metal layer have a same volume ratio.

2. The power module of claim 1, wherein the at least one substrate comprises an upper substrate and a lower substrate,
   wherein the upper substrate is disposed at a portion above the chip and includes: a first insulating layer; and a first outer metal layer and a first inner metal layer bonded to an upper surface and a lower surface of the first insulating layer, respectively, and
   the lower substrate is disposed at a portion under the chip and includes: a second insulating layer; and a second outer metal layer and a second inner metal layer bonded to an upper surface and a lower surface of the second insulating layer, respectively.

3. The power module of claim 2, further comprising a mold part integrally molding the chip, the power lead, the upper substrate, and the lower substrate,
   wherein the power lead is connected to the first inner metal layer or the second inner metal layer and has a portion extending to an outside of the mold part.

4. The power module of claim 1, wherein the inner metal layer includes a pattern to provide an electrical connection relationship with the chip.

5. The power module of claim 4, wherein a perimeter of the outer metal layer is provided to be smaller than the perimeter of the inner metal layer based on the pattern of the inner metal layer.

6. The power module of claim 1, wherein the outer metal layer is provided to have a smaller thickness than the inner metal layer so as to have the same volume ratio as the inner metal layer.

7. The power module of claim 6, wherein the outer metal layer has the distance and the thickness of the outer metal layer are adjusted based on an insulation distance between the outer metal layer and the power lead.

8. The power module of claim 6, wherein the outer metal layer is configured to have the same volume ratio with respect to the inner metal layer by reducing a width and a length of the outer metal layer by a same length.

9. The power module of claim 4, wherein the outer metal layer is provided with the smaller distance than the inner metal layer, wherein the chip and the pattern of the inner metal layer are provided to be all included within an area of the outer metal layer.

* * * * *